(12) United States Patent
Park

(10) Patent No.: US 7,875,489 B2
(45) Date of Patent: Jan. 25, 2011

(54) CMOS IMAGE SENSOR AND FABRICATING METHOD THEREOF

(75) Inventor: Jeong Su Park, Gwanak-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 315 days.

(21) Appl. No.: 12/136,811

(22) Filed: Jun. 11, 2008

(65) Prior Publication Data
US 2009/0057732 A1 Mar. 5, 2009

(30) Foreign Application Priority Data
Aug. 30, 2007 (KR) .................. 10-2007-0087527

(51) Int. Cl.
*H01L 21/00* (2006.01)
(52) U.S. Cl. ................ 438/72; 257/292; 257/E31.127; 257/E21.001
(58) Field of Classification Search ............. 257/292, 257/E31.127; 438/71, 72
See application file for complete search history.

(56) References Cited

U.S. PATENT DOCUMENTS

| 5,425,179 | A | * | 6/1995 | Nickel et al. ............ 33/366.16 |
| 2007/0095565 | A1 | * | 5/2007 | Nagai et al. .................. 174/262 |
| 2010/0155872 | A1 | * | 6/2010 | Park ........................... 257/436 |

FOREIGN PATENT DOCUMENTS

JP 09318850 A * 12/1997

* cited by examiner

*Primary Examiner*—Allan R Wilson
(74) *Attorney, Agent, or Firm*—Sherr & Vaughn, PLLC

(57) ABSTRACT

A CMOS image sensor and a fabricating method for a semiconductor device are disclosed. Embodiments provide a CMOS image sensor having an improved structure using a light reflection system, with a fabricating method thereof to simplify the fabrication process and maximize a light receiving area. Embodiments may be applied to a semiconductor device having a lamination structure.

12 Claims, 5 Drawing Sheets

CMOS IMAGE SENSOR AND FABRICATING METHOD THEREOF

The present application claims priority under 35 U.S.C. 119 to Korean Patent Application No. 10-2007-0087527 (filed on Aug. 30, 2007), which is hereby incorporated by reference in its entirety.

BACKGROUND

Embodiments relate to a semiconductor device, and more particularly, to a CMOS image sensor and a fabricating method thereof. As generally known, an image sensor may be a semiconductor device that converts an optical image to an electric signal. Image sensors may be classified into charge coupled devices (CCD) and complementary metal-oxide semiconductor (CMOS) image sensors. CMOS image sensors use a switching method that employs a MOS transistor for each pixel. CMOS sensors also simultaneously integrate a peripheral control circuit, and a signal processing circuit. The sensor outputs the signal through the MOS transistor. The CMOS image sensor therefore includes a photo diode and a plurality of MOS transistors.

Figure 1:
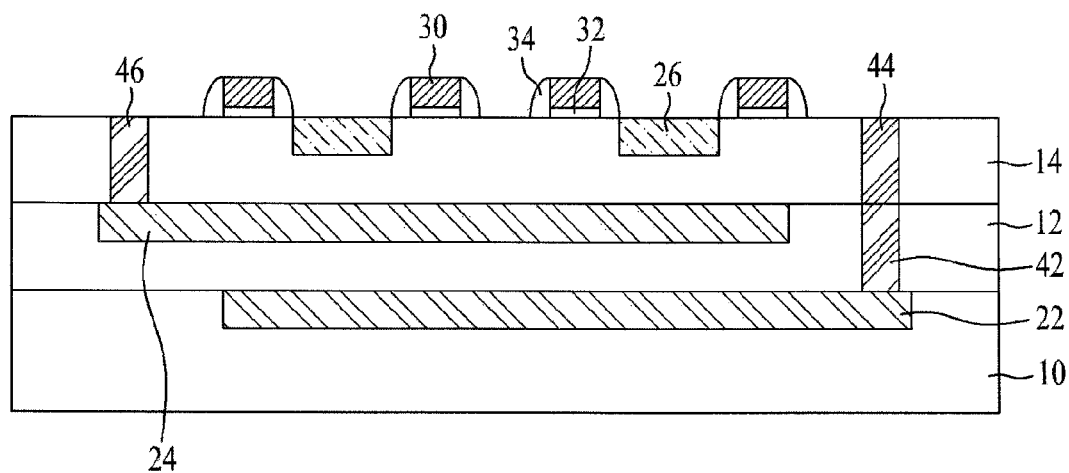

FIG. 1 is a sectional view of a related CMOS image sensor. Referring to FIG. 1, over a semiconductor substrate, for example over a Si substrate 10, a plurality of photo diodes 22, 24 and 26 receive, respectively, red, green and blue light. Photo diodes 22, 24 and 26 may be formed by repeating an ion implantation process and a Si epitaxial growth process.

More particularly, an ion implantation layer for the red photodiode 22 may be formed first over the substrate 10. A first Si epitaxial layer 12 may be formed over the ion implantation layer. The green photodiode 24 may be formed in the first Si epitaxial layer 12 by ion implantation. In addition, a plug 42 for contacting the red photodiode 22 may be selectively formed over the first Si epitaxial layer 12. Next, a second Si epitaxial layer 14 may be formed using the Si epitaxial growth method. Here, the blue photodiode 26 may be formed over the second Si epitaxial layer 14. Additionally, another plug 46 for contact with the green photodiode 24 and yet another plug 44 for contact with the red photodiode 22 may be formed in the Si epitaxial layer 14. Over the second Si epitaxial layer 14, a plurality of the MOS transistors may be formed to transfer photocharges collected by the photodiodes 22, 24 and 26. The plurality of MOS transistors may include a gate 30, a gate dielectric layer 32, and a spacer 34.

In the above-described CMOS image sensor, the red photodiode 22 and the green photodiode 24 occupy a greater area than the blue photodiode 26. However, since the transistors for signal transmission are disposed on the uppermost part of the CMOS image sensor, only the area occupied by the blue photodiode 26 is fully effective as a light receiving area. As a result, the effective light receiving area is smaller than the area occupied by the photodiodes 22, 24 and 26.

Another issue is the plugs 42, 44 and 46 for processing signals of the red photodiode 22 and the green photodiode 24, which may be formed by ion implantation. When light is received from the outside, the plugs 42, 44 and 46 may disrupt and create noise in the light signal. Furthermore, the red, green and blue photodiodes 22, 24 and 26 should be separately formed to prevent interference with one another. To address this issue, a dedicated ion implantation layer for separate photodiodes may be required in the respective epitaxial layers.

SUMMARY

Embodiments relate to a CMOS image sensor having an improved structure using reflected light. Embodiments relate to a CMOS image sensor and a fabrication method thereof capable of simplifying the fabrication process and maximizing a light receiving area by adopting a reflection system.

Embodiments relate to a fabricating method for a CMOS image sensor divided into a device formation area and a peripheral area adjacent to the device formation area. The method may include forming a recess in a peripheral area of a wafer. A liquid material having a predetermined viscosity may be applied to fill a portion of the recess. The wafer may be set at a predetermined angle. A slanted surface may be formed by curing the liquid applied in the recess while the wafer is set at the predetermined angle. A reflection layer may be formed over the slanted surface to reflect light approximately vertically incident to a surface of the wafer along an approximately horizontal direction. A plurality of photodiodes may be formed separately from one another in a device formation area of the wafer. At least one transistor may be formed over an upper surface of the wafer within the device formation area.

The liquid material applied to the inside of the recess may be liquid silicon on glass (SOG). After the liquid SOG is applied to the inside of the recess, the wafer may be set at about 45 degrees. The reflection layer forming step may include vapor-depositing a metal layer over the whole surface of the wafer by sputtering a titanium-based metal and removing the metal layer from the surface of the wafer by polishing the wafer surface.

The reflection layer forming step may include forming a photoresist pattern over an upper part of the wafer within the device formation area, forming a metal layer over the whole surface of the wafer by vapor-depositing a titanium-based metal, and removing the photoresist pattern. The fabricating method may further include filling the remaining recess with the silicon on glass after formation of the reflection layer.

The plurality of photodiodes may be disposed vertically to the wafer surface so as to receive the light reflected by the reflection layer along a horizontal direction. The fabricating method may further include forming plugs for electrically connecting the respective photodiodes to the transistors.

Embodiments relate to a CMOS image sensor divided into a device formation area and a peripheral area adjacent to the device formation area formed on a wafer. A recess may be formed in a peripheral area of the wafer. A slanted portion may be formed in the recess to have a slanted surface. A reflection layer may be formed over the slanted surface of the slanted portion to reflect light vertically incident to a surface of the wafer along a horizontal direction. A plurality of photodiodes may be formed separately from one another in a device formation area of the wafer. At least one transistor may be formed over an upper surface of the wafer within the device formation area.

The slanted portion may be cured silicon on glass. The plurality of photodiodes may be disposed vertically to the wafer surface so as to receive the light reflected by the reflection layer along a horizontal direction.

DRAWINGS

FIG. 1 is a sectional view of a related CMOS image sensor.

Figure 2A:
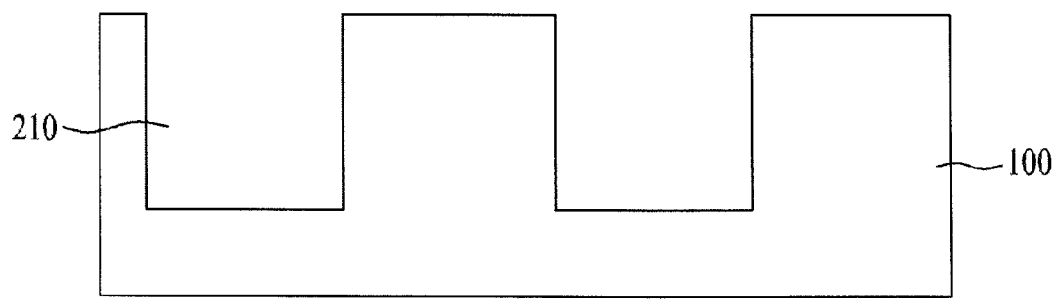
Figure 2B:
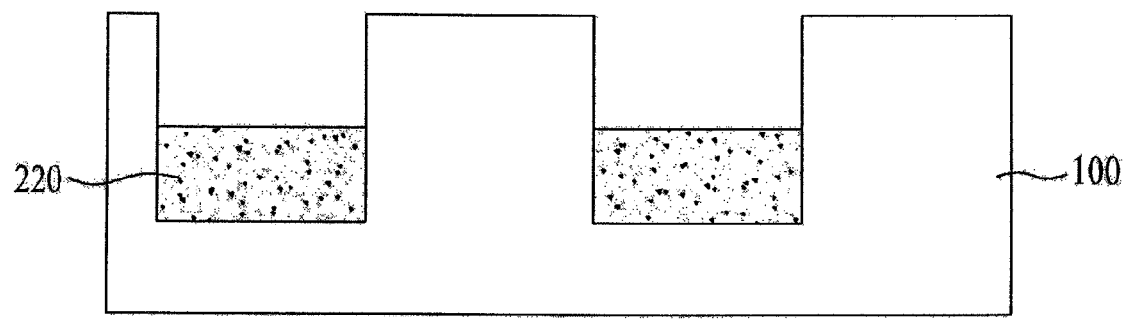
Figure 2C:
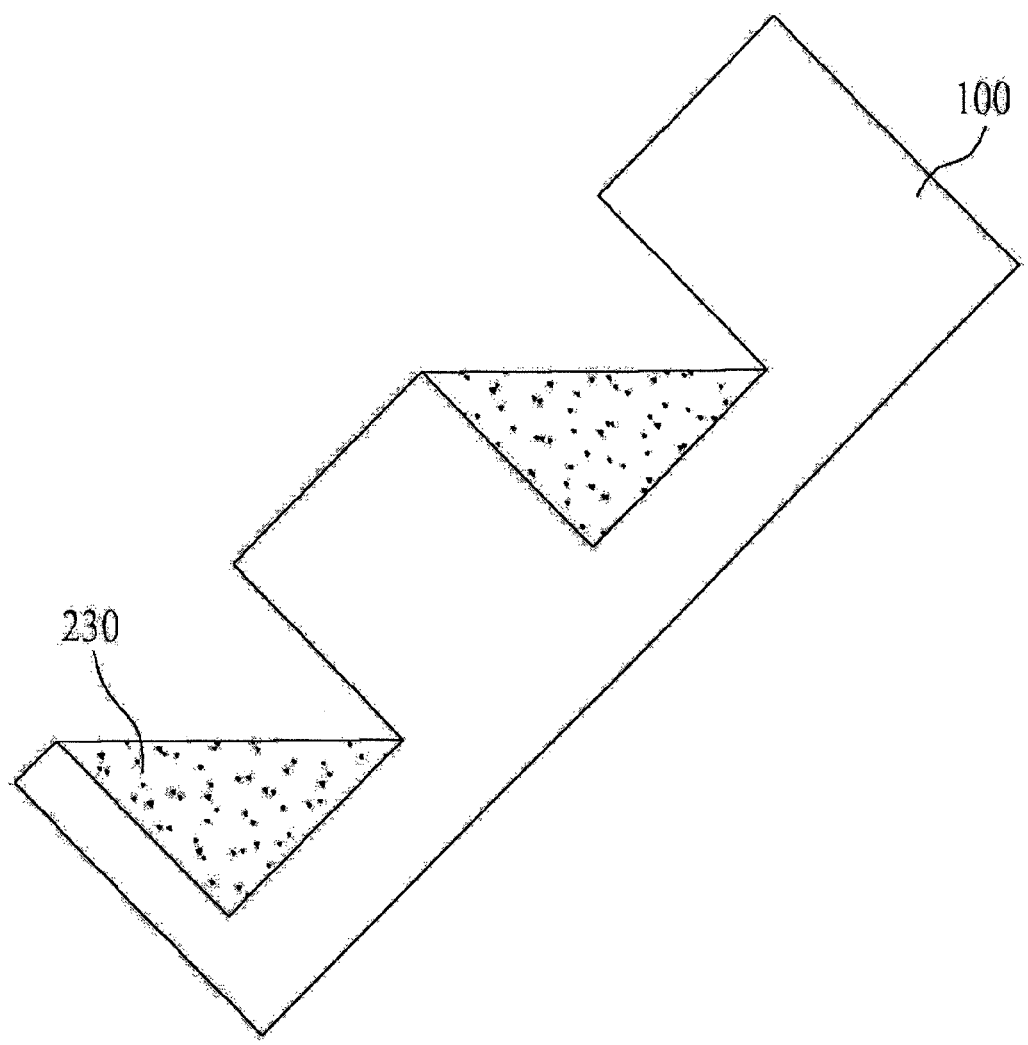
Figure 2D:
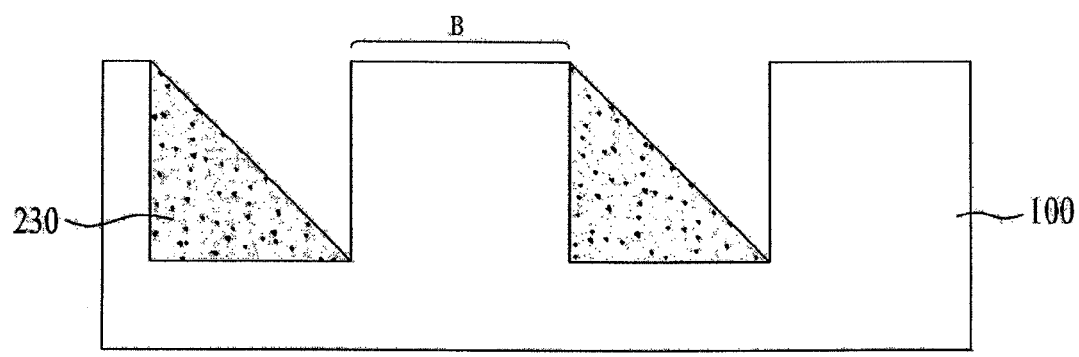
Figure 2E:
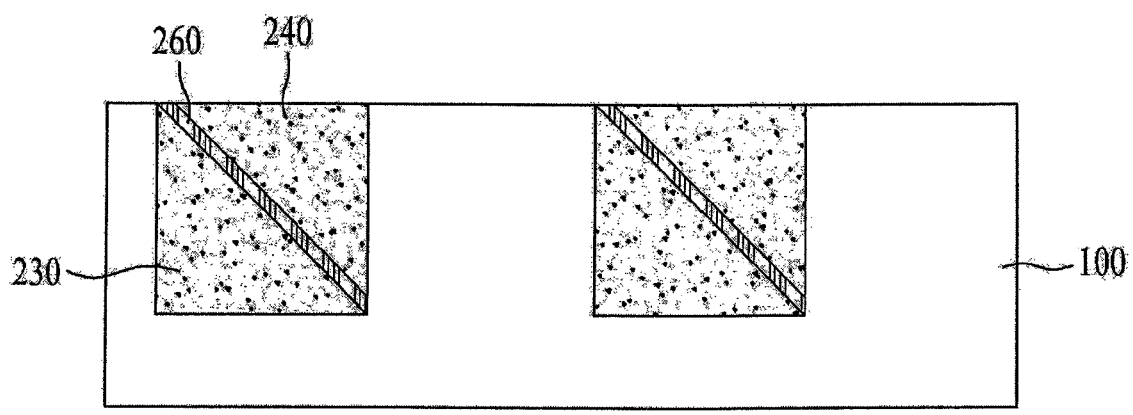
Figure 2F:
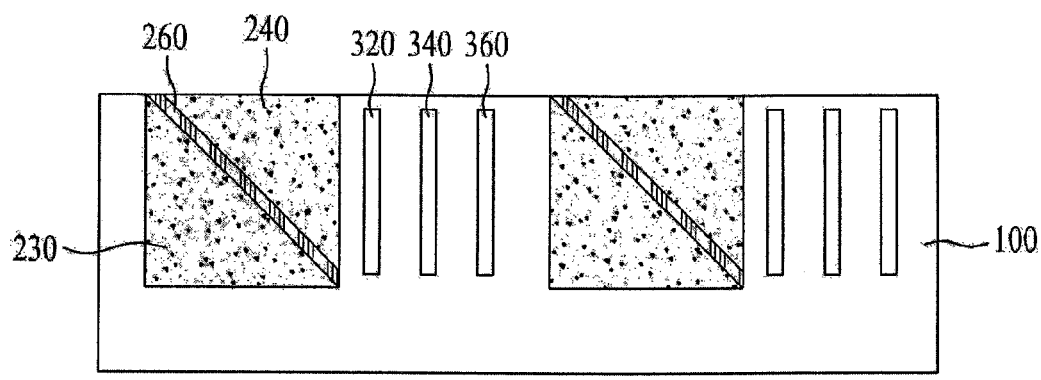
Figure 2G:
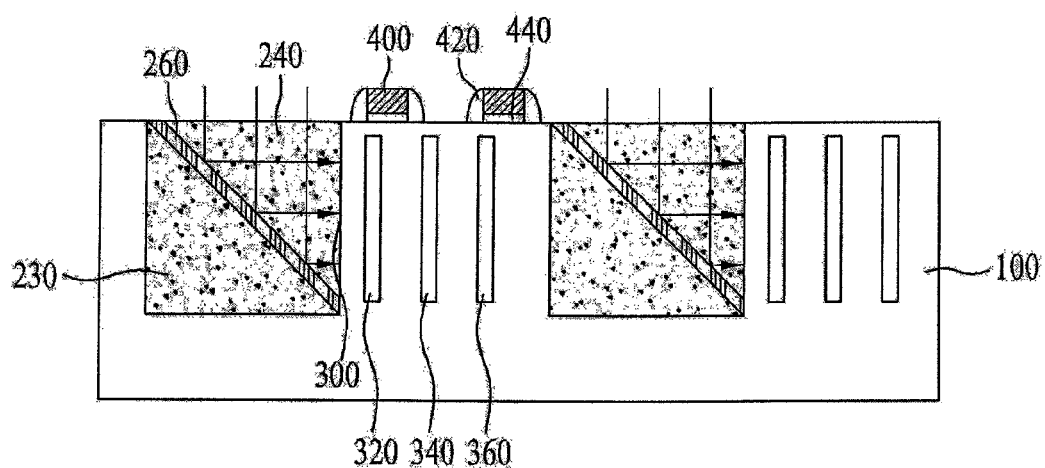

Example FIG. 2A to example FIG. 2G are sectional views illustrating a fabricating method of the CMOS image sensor according to embodiments.

DESCRIPTION

Hereinafter, a CMOS image sensor and a fabricating method thereof according to embodiments will be described in detail. Example FIG. 2A through example FIG. 2G are sectional views illustrating a fabricating method of a CMOS image sensor according to embodiments.

As shown in example FIG. 2A, to fabricate the CMOS image sensor including a photodiode and a MOS transistor according to embodiments, a recess 210 may be formed on a Si semiconductor substrate 100, to allow the subsequent formation of a slanted surface along one side therein. The Si semiconductor substrate 100 may be a Si wafer and will therefore be referenced as Si wafer 100 below.

The recess 210 where the slanted surface will be formed may be produced by dry-etching the wafer 100. Also, for example, the recess 210 may take the form of a cube, with the bottom and sides having equal lengths, widths, and heights.

Next, silicon on glass (SOG) 220 may be applied over the wafer 100 as shown in example FIG. 2B. More particularly, the SOG 220 fills about a half the volume of the recess 210 formed by etching in the previous process. According to embodiments, the SOG 220 may be in the form of a liquid having a predetermined viscosity.

As shown in example FIG. 2C, after the liquid SOG 220 is applied, the wafer 100 may be set at a predetermined slanted angle. For example, the wafer 100 may be slanted by 45 degrees. The SOG 220 applied in the recess 210 may be cured while the wafer 100 is slanted. In other words, the wafer 100 may be baked so that the SOG 220 in the recess 210 is cured at a predetermined slanted angle with respect to the wafer.

After the SOG 220 in the recess 210 is cured by baking the wafer 100, a slanted portion 230 is formed as shown in example FIG. 2D, with one side slanted by approximately 45 degrees and the other side vertical to a surface of the wafer 100. An area B of the wafer surface, adjacent to the slanted portion 230, becomes a device formation area for forming a photodiode and a MOS transistor.

Next, a reflection layer 260 may be formed by vapor-depositing metal over the slanted surface of the slanted portion 230 as shown in example FIG. 2E. The reflection layer 260 reflects light incident approximately vertically to the surface of the wafer 100 along an approximately horizontal direction. For example, titanium or a titanium oxide having a superior reflectivity may be used as the metal to form the reflection layer 260.

More specifically, the reflection layer 260 may be formed by vapor-depositing the metal by sputtering, and polishing the wafer surface. For example, the metal layer may be vapor-deposited by sputtering over the whole surface of the wafer 100 and the wafer surface may be polished chemically or mechanically so that the vapor-deposited metal layer is removed from the wafer surface.

According to another method for forming the reflection layer 260, a photoresist pattern may be formed in the device formation area B through photolithography and the metal layer may be vapor-deposited over the whole surface of the wafer 100. In this state, by removing the photoresist pattern, the metal reflection layer 260 can be formed over the slanted surface of the slanted portion 230.

Alternatively, after the reflection layer 260 is formed, a remaining space in the recess 210 may be filled by applying the SOG 240 in the space. Here, the SOG 240 filling the space may be capable of transmitting the incident light almost perfectly. However, the SOG 240 applied over the reflection layer 260 can be omitted in accordance with the structure of the device.

As shown in example FIG. 2F, a plurality of photodiodes 320, 340 and 360 may be formed by repeated ion implantation processes applied to the device formation area B of the wafer 100. The photodiodes 320, 340 and 360 may be vertical to the wafer surface, to horizontally receive the light vertically incident to the wafer surface. According to embodiments, an ion implantation layer for forming the photodiodes 320, 340 and 360 may be formed to be vertical to the wafer surface, that is, parallel to a light receiving surface 300 (example FIG. 2G) by varying ion implantation energy through the ion implantation process.

The plurality of photodiodes 320, 340 and 360 may be disposed separately, that is, in isolated positions from one another within the device formation area B of the wafer 100. In addition, a blue photodiode 320, a green photodiode 340 and a red photodiode 360 may be arranged in the above order from the light receiving surface 300 (example FIG. 2G).

Finally, as shown in example FIG. 2G, the MOS transistors may be formed in the device formation area B of the wafer surface to include a gate electrode 400, a gate dielectric 440 and a spacer 420. Here, conductive plugs which electrically connect the respective photodiodes 320, 340 and 360 with the MOS transistors may be included so that signals generated from the photodiodes 320, 340 and 360 can be transmitted to the MOS transistors.

In the CMOS image sensor according to embodiments, the light approximately vertically incident to the surface of the wafer 100 is reflected by the reflection layer 260 to be approximately horizontal to the wafer surface. The reflected light may be received approximately normal to the light receiving surface 300 and collected to the plurality of photodiodes 320, 340 and 360. The photodiodes 320, 340 and 360 accordingly generate electric signals and the signals are transmitted to the MOS transistors.

Hereinafter, the structure of a CMOS image sensor which may be fabricated through the above methods will be described with reference to example FIG. 2G. The CMOS image sensor fabricated as above includes photodiodes and MOS transistors. More specifically, the CMOS image sensor according to embodiments may be divided into the device formation area B on which the photodiodes and the MOS transistors may be formed, and a peripheral area which may be adjacent the device formation area B. Particularly, the peripheral area reflects the incident light toward the device formation area B.

In the CMOS image sensor, a recess 210 may be formed to hold a reflection layer 260 over the peripheral area of the wafer 100. Therefore, the peripheral area may include the reflection layer 260 which reflects the light vertically incident to the wafer surface by a predetermined angle, and a recess 210 in which the reflection layer 260 is formed.

At a lower part of the reflection layer 260 formed in the recess 210, a slant surface may be formed with the same angle as the reflection layer 260 and accordingly, the peripheral area includes the slanted portion 230 formed in the recess 210 to have the slanted surface. The reflection layer 260 reflects the light vertically incident to the surface of the wafer 100 along an approximately horizontal direction. Here, the reflection angle may be approximately 90 degrees.

To set the reflection angle to approximately 90 degrees, the reflection layer 260 may be oriented at 45 degrees with respect to the wafer surface. Since the reflection layer 260 is formed over the slanted surface of the slanted portion 230, the slanted surface may also be slanted by 45 degrees.

The slanted portion 230 may be formed by applying a liquid SOG having a predetermined viscosity in the recess 210, filling about half of the recess 210 and then curing the applied SOG with the wafer 100 slanted by about 45 degrees. Since the method of forming the slanted portion 230 has already been described, a detailed description thereof will be omitted.

The reflection layer 260 may be made of metal, for example, titanium or a titanium-based metal such as a titanium oxide, which has a superior reflectivity. According to embodiments, the material of the reflection layer 260 is not limited to those titanium-based metals. Therefore, various other metals having a superior reflectivity can be used according to embodiments.

Thus, the structure for transmitting the incident light to the device formation area may be formed at the peripheral area of the CMOS image sensor according to embodiments. Furthermore, the device formation area of the CMOS image sensor may include a plurality of the photodiodes 320, 340 and 360 disposed within the wafer 100 and separately from one another, and at least one MOS transistor formed over an upper surface of the wafer 100.

The plurality of photodiodes 320, 340 and 360 may be positioned to be approximately vertical to the surface of the wafer 100 so as to receive the light incident from the peripheral area, that is, the light reflected by the reflection layer 260. The photodiodes 320, 340 and 360 may be arranged in order, with the blue photodiode 320 closest, the green photodiode 340 in the middle, and the red photodiode 360 furthest from the surface receiving the reflected light.

In general, the depth of penetration of blue light is relatively short and a red light is relatively long. Therefore, the blue photodiode 320 may be disposed closest to the light receiving surface 300 while the red photodiode 360 may be disposed farthest from the light receiving surface 300.

Furthermore, according to embodiments, the slanted surface of the slanted portion 230 may be slanted by 45 degrees with respect to the wafer surface such that the light being reflected by the reflection layer 260 can be incident vertically to the light receiving surface 300. In addition, the MOS transistor formed over the surface of the wafer 100 within the device formation area B may include a gate electrode 400, a gate dielectric 440 and a spacer 420.

As apparent from the above description, in accordance with a CMOS image sensor and a fabricating method thereof according to the above-described embodiments, an improved CMOS image sensor using reflected light can be provided. In the CMOS image sensor according to embodiments, since the incident light may be reflected by approximately 90 degrees and received by the photodiodes, opaque devices interrupting the light can be formed over the photodiodes without deteriorating the operation of the CMOS image sensor. Accordingly, this structure may be advantageous in forming a device having a lamination structure. In addition, an area that senses the light, that is, the area of the light receiving surface may be expanded.

Moreover, because the respective photodiodes are in electric connection with the MOS transistors by independent contact plugs, a distance between the photodiode and the transistor can be minimized. As a result, a complicated ion implantation process for forming the plugs to achieve electric connection among the photodiodes does not have to be performed. Consequently, noise introduced into the light signals by the plugs may be prevented, thereby improving the capability of the device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a recess in a peripheral area of a wafer;
   applying a liquid material having a predetermined viscosity to fill a portion of the recess;
   setting the wafer at a predetermined angle;
   forming a slanted surface by curing the liquid applied in the recess while the wafer is set at the predetermined angle;
   forming a reflection layer over the slanted surface to reflect light approximately vertically incident to a surface of the wafer along an approximately horizontal direction;
   forming a plurality of photodiodes separately from one another in a device formation area of the wafer; and
   forming at least one transistor over an upper surface of the wafer within the device formation area.

2. The method of claim 1, wherein the recess is formed by performing a dry-etching process on the peripheral area of the wafer.

3. The method of claim 1, wherein the liquid material fills half the recess.

4. The method of claim 1, wherein a liquid silicon on glass is applied to the inside of the recess.

5. The method of claim 1, wherein, after the liquid silicon on glass is applied to the inside of the recess, the wafer is set at about 45 degrees.

6. The method of claim 1, wherein forming the reflection layer comprises:
   vapor-depositing a metal layer over the whole surface of the wafer by sputtering a titanium-based metal; and
   removing the metal layer from the surface of the wafer by polishing the wafer surface.

7. The method of claim 1, wherein forming the reflection layer comprises:
   forming a photoresist pattern over an upper part of the wafer within the device formation area;
   forming a metal layer over the whole surface of the wafer by vapor-depositing a titanium-based metal; and
   removing the photoresist pattern.

8. The method of claim 1, further comprising filling the remaining recess with the silicon on glass after formation of the reflection layer.

9. The method of claim 1, wherein the plurality of photodiodes are disposed vertically to the wafer surface so as to receive the light reflected by the reflection layer along a horizontal direction.

10. The method of claim 1, wherein the plurality of photodiodes are arranged in an order of a blue photodiode, a green photodiode, and a red photodiode from a light receiving surface.

11. The method of claim 1, further comprising forming plugs for electrically connecting the respective photodiodes to the transistors.

12. The method of claim 1, wherein the device formation area and peripheral area form a CMOS image sensor.

* * * * *